United States Patent [19]
Suzuki et al.

[11] Patent Number: 4,558,234
[45] Date of Patent: Dec. 10, 1985

[54] COMPLEMENTARY MOSFET LOGIC CIRCUIT

[75] Inventors: Yasoji Suzuki, Yokosuka; Kenji Matsuo, Yokohama, both of Japan

[73] Assignee: Tokyo Shibaura Denki Kabushiki Kaisha, Japan

[21] Appl. No.: 652,429

[22] Filed: Sep. 20, 1984

Related U.S. Application Data

[62] Division of Ser. No. 351,252, Feb. 22, 1982.

[30] Foreign Application Priority Data

Feb. 25, 1981 [JP] Japan ................................ 56-26376
Jun. 24, 1981 [JP] Japan ................................ 56-97712
Nov. 6, 1981 [JP] Japan ................................ 56-178162

[51] Int. Cl.[4] ................ H03K 19/092; H03K 19/003; H03K 19/01; H03K 19/094
[52] U.S. Cl. .................................... 307/446; 307/443; 307/451; 307/475
[58] Field of Search ................... 307/200 B, 443, 446, 307/451, 475, 270, 264, 570, 584, 585

[56] References Cited

U.S. PATENT DOCUMENTS

| | | | |
|---|---|---|---|
| 3,609,479 | 9/1971 | Lin et al. | 307/446 X |
| 3,631,528 | 12/1971 | Green. | |
| 3,649,843 | 3/1972 | Redwine et al. | 307/446 |
| 4,032,795 | 6/1977 | Hale | 307/451 |
| 4,192,016 | 3/1980 | Taylor | 307/465 X |
| 4,258,272 | 3/1981 | Huang | 307/475 |
| 4,280,065 | 7/1981 | Minato et al. | 307/448 X |
| 4,295,065 | 10/1981 | Hsieh et al. | 307/451 X |
| 4,301,383 | 11/1981 | Taylor | 307/446 X |
| 4,406,957 | 9/1983 | Atherton | 307/475 |
| 4,425,516 | 1/1984 | Wanlass | 307/475 X |

FOREIGN PATENT DOCUMENTS

| | | | |
|---|---|---|---|
| 2373921 | 7/1978 | France | 307/475 |
| 0058323 | 5/1979 | Japan | 307/475 |
| 0141827 | 11/1980 | Japan | 307/446 |

OTHER PUBLICATIONS

"CMOS: Higher Speeds, More Drive and Analog Capability Expand Its Horizons", Bingham, 2328 Electronic Design, vol. 26, No. 23, (Nov. 1978), pp. 74–82.
Zusammenschaltung von Digitalen CMOS-Schaltkreisen Mit Anderen Logik-Familien, Turinsky, Radio Fernsehen Elektronic, 26, (1977), H.3, pp. 76–78.

Primary Examiner—Larry N. Anagnos
Attorney, Agent, or Firm—Finnegan, Henderson, Farabow, Garrett & Dunner

[57] ABSTRACT

Disclosed is a complementary MOSFET logic circuit having a complementary MOS inverter with a pregiven ratio of the channel widths of a P channel MOSFET and an N channel MOSFET and pregiven threshold voltages of the FETs so as to have an input voltage characteristic adapted to an output voltage characteristic, and a buffer circuit which includes a bipolar transistor for receiving at the base thereof a signal from the output terminal of the complementary MOS inverter and an N channel MOSFET for receiving at the gate thereof an input signal applied to the complementary MOS inverter. The inverter and buffer are connected in series to one another between a high potential applying point and a low potential applying point, and a signal corresponding to a logic output signal of the complementary MOS inverter is produced at the output terminal thereof.

25 Claims, 23 Drawing Figures

F I G. 3
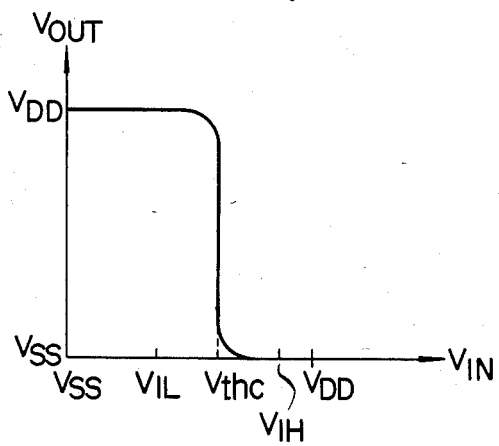

F I G. 6
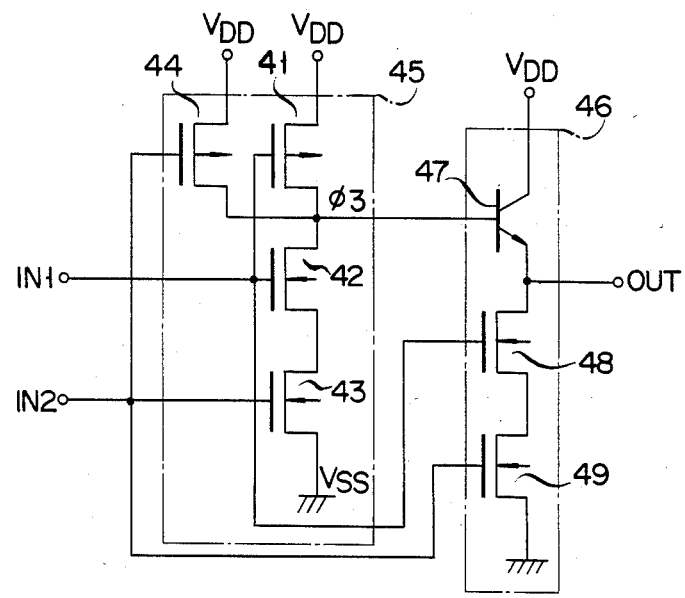
F I G. 7
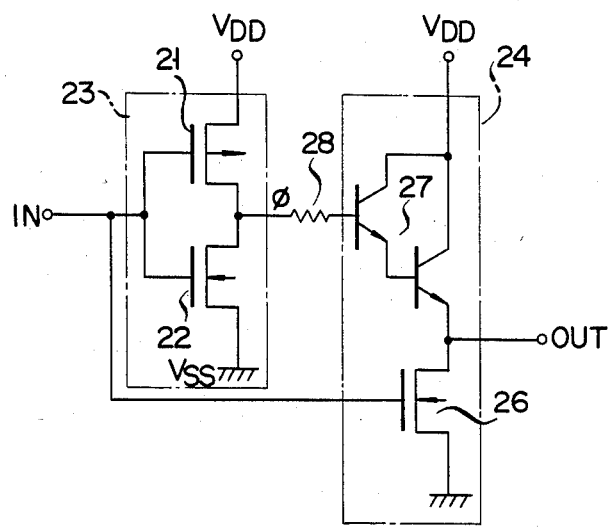

F I G. 16
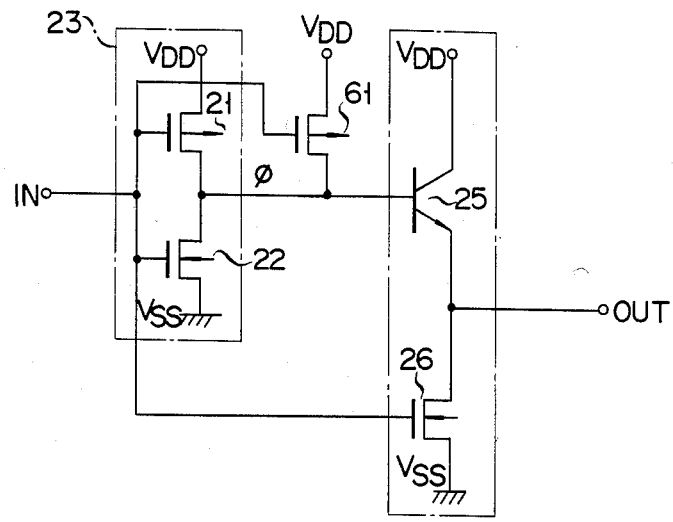
F I G. 17
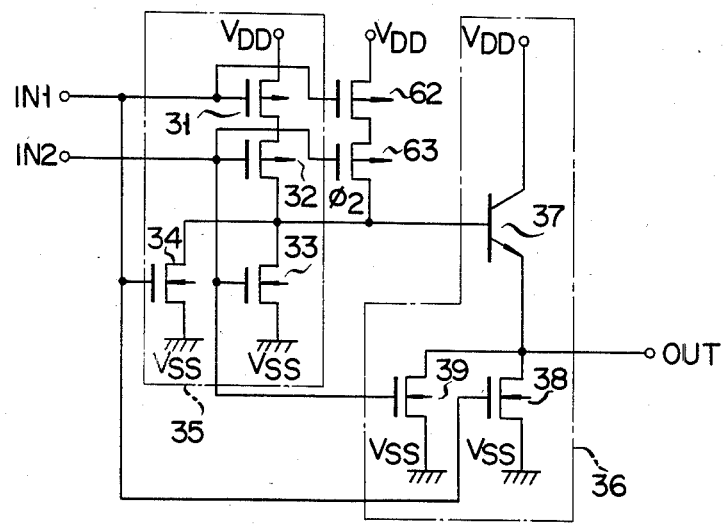

COMPLEMENTARY MOSFET LOGIC CIRCUIT

This application is a division of application Ser. No. 351,252, filed Feb. 22, 1982.

BACKGROUND OF THE INVENTION

The present invention relates to a high speed complementary MOSFET logic circuit which is interchangeable with a TTL circuit.

An integrated circuit formed of complementary MOSFETs (referred to as CMOSFETs) has many advantages such as low power dissipation, high noise-tolerance and wide dynamic voltage range. Since the operation of a CMOSFET circuit with such advantages is slower than a TTL circuit (transistor-transistor logic), a CMOSFET circuit replaces a TTL circuit only when a relatively slow operation is required. Recently, remarkable progress in microelectric technology has realized high speed operable CMOSFETs. Many attempts have been made to realize a high performance circuit with low power dissipation and high speed operation, in which a low power but high speed CMOSFET circuit, in place of the high power TTL circuit, is combined with an LS (Low power Schottky) TTL circuit having a relatively lower power dissipation.

With respect to an output characteristic of a TTL circuit such as an LS-TTL circuit, when the power source voltage $V_{DD}$ is 5 V, a high level voltage $V_{OH}$ is approximately a 2 V minimum and a low level voltage $V_{OL}$ is approximately a 0.8 V maximum. An input voltage characteristic of a CMOSFET circuit, is that, when the power source voltage $V_{DD}$ is 5 V, a high level voltage $V_{IH}$ is approximately 4 V, a low level voltage $V_{IL}$ is approximately 1 V, and a circuit threshold voltage $V_{thc}$ is half of the power source voltage $V_{DD}$, i.e., approximately 2.5 V.

Referring to FIG. 1, when a high speed CMOSFET circuit 2 is used in a system circuit which is mostly formed of an LS-TTL circuit 1, an interface circuit 3 such as a boost circuit must be provided at the prestage of the CMOSFET circuit 2. For obtaining a high speed CMOSFET circuit which is perfectly compatible with the TTL circuit, without the interface circuit 3, its input characteristic must be modified so as to be adaptable to the output characteristic of the TTL circuit. For example, when $V_{DD}$ is 5 V, the input voltage characteristic of the CMOSFET circuit must be set such that $V_{IH} \simeq 2$ V and $V_{IL} \simeq 0.8$ V, in order to comply with the output level of the TTL circuit.

FIG. 2 shows a circuit diagram of a prior CMOS inverter in which a P channel MOSFET (referred to as a PMOSFET) 11 and an N channel MOSFET (referred to as an NMOSFET) 12 are inserted in series between power source voltages $V_{DD}$ and $V_{SS}$, an input signal IN is commonly applied to the gates of the FETs 11 and 12, and an output signal OUT is derived from a junction of the FETs 11 and 12. The inverter thus arranged has an input voltage $V_{IN}$ vs. output voltage $V_{OUT}$ characteristic as shown in FIG. 3. An input voltage $V_{IN}$, when the output voltage $V_{OUT}$ shifts from $V_{SS}$ to $V_{DD}$ or vice versa, is a circuit threshold voltage $V_{thc}$. The circuit threshold voltage, when the FETs 11 and 12 are in a saturated state, is expressed by the following equation:

$$V_{thc} = \frac{V_{thN} + \sqrt{K_P/K_N}\,(V_{DD} - |V_{thP}|)}{1 + \sqrt{K_P/K_N}}, \tag{1}$$

where
$V_{thN}$: threshold voltage of the NMOSFET,
$V_{thP}$: threshold voltage of the PMOSFET,
$K_P$: coefficient of the source-drain current of the PMOSFET, and
$K_N$: coefficient of the source-drain current of the NMOSFET.

These coefficients $K_P$ and $K_N$ are also:

$$K_P = \tfrac{1}{2} \cdot \frac{W_P}{L_P} \cdot \frac{\epsilon_{ox}}{t_{ox}} \cdot \mu_P, \tag{2}$$

$$K_N = \tfrac{1}{2} \cdot \frac{W_N}{L_N} \cdot \frac{\epsilon_{ox}}{t_{ox}} \cdot \mu_N, \tag{3}$$

where
$W_P$: channel width of the PMOSFET,
$W_N$: channel width of the NMOSFET,
$L_P$: channel length of the PMOSFET,
$L_N$: channel length of the NMOSFET,
$t_{ox}$: thickness of the gate oxide film,
$\epsilon_{ox}$: dielectric constant,
$\mu_P$: effective mobility of holes, and
$\mu_N$: effective mobility of electrons.

As seen from equation (1), in order to improve the electrical characteristics of the input voltage $V_{IH}$ and $V_{IL}$ of the high speed CMOSFET circuit (inverter), that is, to change the input voltage $V_{IH}$ from 4 V to 2 V when $V_{DD}=5$ V or to reduce the threshold voltage $V_{thc}$, the $V_{thP}$ is enlarged and the coefficient $K_P$ is reduced. This may be attained by adjusting the conductance $g_m$ of the PMOSFET 11. When these factors $V_{thP}$ and $K_P$ are changed as just mentioned, however, a rise time $t_r$, for example, when the high speed CMOS inverter operates, is made larger than that before these factors were changed, resulting in the deterioration of the operation speed of the inverter. Thus, the prior CMOSFET circuit has difficulty in gaining both high operation speed and perfect compatibility with the TTL circuit.

SUMMARY OF THE INVENTION

Accordingly, an object of the present invention is to provide a complementary MOSFET logic circuit with an electric characteristic providing perfect compatibility with a TTL circuit.

Another object of the present invention is to provide a complementary MOSFET logic circuit capable of boosting a voltage amplitude of an output signal up to the power source voltage.

Yet another object of the present invention is to provide a complementary MOSFET logic circuit which can sustain its normal operation even when the power source voltage drops from a normal value to a low value.

According to the present invention, there is provided a complementary MOSFET logic circuit comprising: a complementary MOSFET with a pregiven ratio of channel widths of a P channel MOSFET and an N channel MOSFET and pregiven threshold voltages of FETs so as to provide an input voltage characteristic corresponding to an output voltage characteristic of a TTL circuit; and a buffer circuit such with an arrangement that a bipolar transistor, receiving at the base a signal from the output terminal of the complementary MOSFET circuit, and at least one MOSFET, receiving at the gate an input signal for transmission to the complementary MOSFET circuit, are inserted in series between a high potential applying point and a low potential applying point. From an output terminal of the arrangement, an output signal corresponding to a logic output signal of the complementary MOSFET circuit is derived.

BRIEF DESCRIPTION OF THE DRAWINGS

FIG. 3 illustrates a relationship of input and output voltages in a CMOS inverter;

FIG. 6 shows a circuit diagram of yet another embodiment of a complementary MOSFET logic circuit according to the present invention;

FIG. 7 shows a circuit diagram of still another embodiment of a complementary MOSFET logic circuit according to the present invention;

FIG. 16 is a circuit diagram of a complementary MOSFET logic circuit which is an embodiment of the present invention;

FIG. 17 is a circuit diagram of an additional embodiment of a complementary MOSFET logic circuit according to the present invention;

DETAILED DESCRIPTION OF THE PREFERRED EMBODIMENTS

Figure 1:
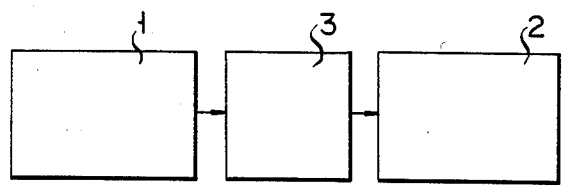
FIG. 1 is a block diagram for illustrating how a prior high speed CMOSFET circuit is applied to a TTL circuit.
Figure 2:
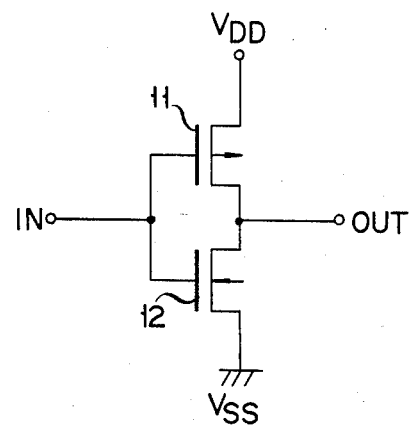
FIG. 2 shows a circuit diagram of a prior CMOS inverter arrangement.
Figure 4:
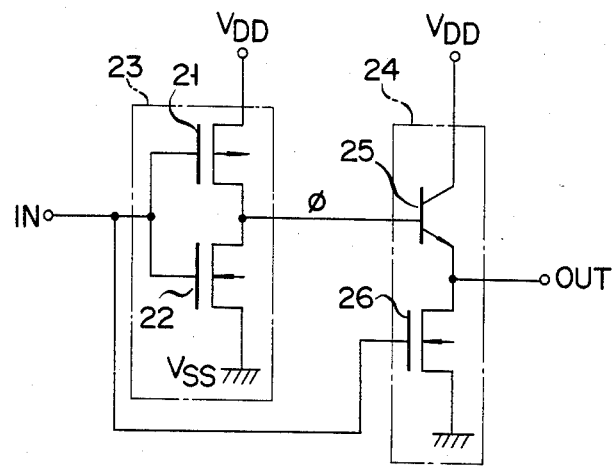
FIG. 4 shows a circuit diagram of an embodiment of a complementary MOSFET logic circuit according to the present invention.

FIG. 4 shows a complementary MOSFET logic circuit which is an embodiment of the present invention. As shown, the logic circuit has a CMOSFET circuit 23 as a CMOS inverter, in which a PMOSFET 21 and an NMOSFET 22 are inserted in series between power source voltages $V_{DD}$ and $V_{SS}$ (high and low potential applying points). An input signal IN is applied to the gates of the PMOSFET 21 and the NMOSFET 22. An output signal $\phi$ of the CMOSFET circuit 23 derived from a junction between the PMOSFET 21 and the NMOSFET 22 is applied to the base of the bipolar transistor 25 in a buffer circuit 24. The buffer circuit 24 is comprised of the bipolar transistor 25 and the NMOSFET 26, receiving at the gate the input signal IN, which are inserted between the power source voltages $V_{DD}$ and $V_{SS}$. An output signal OUT is derived from the emitter of the transistor 25 in the buffer circuit 24.

The operation of the circuit as mentioned above will be described. In a condition that the CMOSFET circuit 23 is compatible with a TTL circuit of 2.0 V and 0.8 V for input voltages $V_{IH}$ and $V_{IL}$ when $V_{DD}=5$ V, an electrical characteristics allowing a normal operation of the CMOSFET circuit 23 must be arranged, e.g., by reducing the threshold voltage $V_{thc}$ of the CMOSFET circuit. Where the CMOSFET circuit is fabricated by the conventional CMOS process and the circuit threshold voltage $V_{thc}$ is set at a small value, for example, 1 to 2 V, when the threshold voltages $V_{thP}$ and $V_{thN}$ of the PMOSFET 21 and the NMOSFET 22 have conventional values (normally 1 V or so) and only the coefficient $K_P$ or $K_N$ is changed in equation (1), the PMOSFET 21 and NMOSFET 22 are both turned on when IN=-$VI_H=+2.0$ V, and a DC leakage-current is generated. As a result, a low power dissipation feature, which is an essential feature of the CMOSFET, is lost. Therefore, the threshold voltages $|V_{thP}|$ and $V_{thN}$ of the PMOS and NMOSFETs 21 and 22 must be selected so as to avoid such a problem. To turn off the PMOSFET 21 when $V_{IN}=V_{IH}$, the threshold voltage $|V_{thP}|$ is:

$$|V_{thP}| \geq V_{DD}-V_{IH} \tag{4}$$

To turn off the NMOSFET 22 when $V_{IN}=V_{IL}$ (to increase the level of the output signal $\phi$ from the CMOSFET circuit 23), the threshold voltage $V_{thN}$ is:

$$V_{thN} \geq V_{IL} \tag{5}$$

Specifically, these threshold voltages must be set to $|V_{thP}| \geq 3.0$ V and $V_{thN} \geq 0.8$ V. These values of the threshold voltages may be obtained by subjecting the PMOS and NMOSFETs 21 and 22 to the conventional surface concentration control process or the like.

To hold the high speed operation of the CMOSFET circuit 23 with such an electric characteristic, a buffer circuit 24 is needed. The operation speed of the CMOS- FET circuit 23, that is, a transient time $t_{sw}$ (rise time $t_r$ and fall time $t_f$) of the switching, is generally given by the following relation (6):

$$t_{sw} \propto C_L/I_{DS} \quad (6)$$

where $C_L$ represents a load capacitance and $I_{DS}$ indicates a source-drain current. If $I_{DS}$ is a saturation current:

$$I_{DS} = K(V_{gs} - V_{th})^2 \quad (7)$$

where $V_{gs}$ indicates a gate-source voltage.

In order to suppress the increase of the transient time $t_{sw}$ and to hold the high speed operation in the prior CMOSFET circuit, it is necessary to prevent a decrease in the saturation current $I_{DS}$ per unit load capacitance from being decreased. Specifically, in connection with the rise time $t_r$, when $V_{IN} = V_{IL}$ and the PMOSFET 21 is turned on, the gate-source voltage $V_{gsP}$ of The PMOSFET 21 is:

$$V_{gsP} = V_{DD} - V_{IL} \simeq 5 - 0.8 \simeq 4.2 \ V \quad (8)$$

The $V_{gsP}$ is not much different from that of the prior high speed CMOSFET circuit (4 V: $V_{IH} \simeq 4$ V, $V_{IL} \simeq 1$ V). Therefore, it is seen from equation (7) that a change in the threshold $V_{thP}$ of the PMOSFET 21 substantially affects the $I_{DS}$, i.e., the rise time $t_r$. From the view point of low power consumption, the threshold $V_{thP}$ was set to $|V_{thP}| = 3.0$ V. If it is assumed that $|V_{thP}| = 3$ V, from the relation of equations (7) and (8), we have:

$$(V_{gs} - V_{thP})^2 = (4.2 - 3)^2 = 1.44 \quad (9)$$

Similarly, the prior high speed CMOSFET circuit has the following relation:

$$(V_{gsP} - V_{thP})^2 = (4-1)^2 \simeq 9 \quad (10)$$

In the meantime, when elements outside the IC are directly driven by an output signal from a general CMOS inverter (fabricated into an IC), the load capacitance $C_L$ is large. In the present example, $C_L \simeq 20$ PF. Since the load capacitance $C_L$ of the CMOSFET circuit is present within the IC, its value is small, i.e., $C_L \simeq 1$ PF. The value of 1 PF corresponds to an interconnection length of 3,380 m when the interconnection width is 6 m and the thickness of the field oxide film is 7,000 Å, thus having a sufficient margin. Accordingly, in order that the rise time $t_r$ is equal to that of the prior CMOSFET circuit, when the coefficient of the $I_{DS}$ of the PMOSFET in the CMOSFET circuit is $K_P'$, from the relations of equations (6), (7), (9) and (10), we have the coefficient $K_p$ of the PMOSFET 21 given by:

$$K_P = K_P' \cdot 1/20 \cdot 9/1.44 \simeq 0.3 \ K_P' \quad (11)$$

The rise time $t_r$ of the output signal OUT is:

$$K_P = 0.6 \ K_P' \quad (12)$$

because it passes through the transistor 25.

In connection with the fall time $t_f$, when the NMOSFET 22 is ON in a condition that $V_{IN} = V_{IH}$, the gate-source voltage $V_{gsN}$ of the NMOSFET 22 is:

$$V_{gsN} = V_{IH} \simeq 2.0 \ V \quad (13)$$

When the gate-source voltage $V_{gsN}$ is compared to that of the prior high speed CMOSFET circuit ($V_{IH} \simeq 4$ V), the difference between them is two times the value of the $V_{gsN}$. Therefore, this greatly influences the fall time $t_f$. When $V_{thN} = 0.8$ V, as in the previous case, from equation (13), we have:

$$(V_{gsN} - V_{thN})^2 = (2.0 - 0.8)^2 = 1.44 \quad (14)$$

Similarly, when assuming that $V_{thN} = 1$ V in the high speed CMOSFET circuit:

$$(V_{gsN} - V_{thN})^2 = (4-1)^2 = 9 \quad (15)$$

Accordingly, in order that the fall time $t_f$ is equal to that of the prior high speed CMOSFET circuit, from the relations of equations (6), (7), (14) and (15), we have the coefficient $K_N$ of the NMOSFET 22 given below:

$$K_N = K_N' \cdot 1/20 \cdot 9/1.44 \simeq 0.3 \ K_N' \quad (16)$$

where $K_N'$ is the coefficient of the $I_{DS}$ of the NMOSFET in the prior CMOS circuit.

In this way, the rise time $t_r$ and the fall time $t_f$ of the output signal $\phi$ from the CMOSFET circuit 23 can set the coefficients $K_P$ and $K_N$ of the PMOSFET 21 and the NMOSFET 22 so as to correspond to the prior high speed CMOSFET circuit. However, the rise time $t_{ro}$ and the fall time $t_{fo}$ of the output signal OUT for driving the external elements are determined by the buffer circuit 24. The rise time $t_{ro}$ of the output signal OUT depends on a current amplification factor $\beta$ (common emitter amplification factor) of the bipolar transistor 25 supplied with the signal $\phi$. The driving power current of the transistor 25 corresponds to $K_P \beta$. Generally, when the transistor 25 (in this case, an NPN type transistor) is manufactured in a factory, $\beta \simeq 50$ to 100. Accordingly, sufficient driving power current can be obtained, so that it is easy to change the rise time $t_{ro}$ to the time $t_r$. Further, the fall time $t_{fo}$ of the output signal OUT depends on the coefficient $K_{N2}$ of the $I_{DS}$ of the NMOSFET 26. When the load capacitance $C_L$ is equal to that (20 PF) of the CMOSFET circuit, then:

$$K_{N2} \simeq K_N' \cdot 20/20 \cdot 9/1.44 \simeq 6 \ K_N' \quad (17)$$

In the normal manufacturing process of the CMOSFETs, the following relations hold: $\mu_P:\mu_N \simeq 1:2$ and $W_P:W_N \simeq 2:1$. From equations (2), (3), (12) and (16), the ratios of the coefficients $K_P$, $K_N$ and $K_{N2}$ of the PMOSFET 21, NMOSFET 22 and NMOSFET 26 are expressed in terms of the channel widths $W_P$, $W_N$ and $W_{N2}$ by:

$$W_P:W_N = 4:1 \quad (18)$$

and $$W_N:W_{N2} = 1:20 \quad (19)$$

The equation (19) may be replaced by $W_N:W_{N2} = 1:12$ when the threshold voltage $V_{thN}$ is reduced to approximately 0.5 V.

As described above, if the threshold value $V_{thc}$ of the CMOSFET circuit 23 is reduced (specifically, the $|V_{thP}|$ is enlarged and the coefficient $K_P$ is reduced) in order to perfectly adapt the CMOSFET circuit to the TTL circuit in their electrical characteristics, the rise time $t_{ro}$ and the fall time $t_{fo}$ of the output signal OUT may be reduced by the buffer circuit 24 comprised of a bipolar transistor 25 with a large current amplification factor and an NMOSFET 26 with a large coefficient $K_N$ of the $I_{DS}$. Thus, a CMOS inverter with a high speed operation can be constructed.

Figure 5:
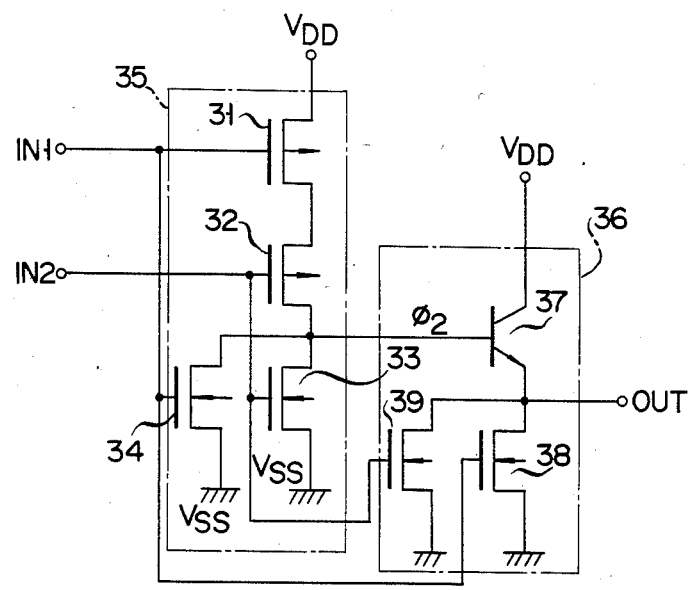
FIG. 5 shows a circuit diagram of another embodiment of a complementary MOSFET logic circuit according to the present invention.

Turning now to FIGS. 5 and 6, there are shown other embodiments of a complementary MOSFET logic circuit according to the present invention. In the embodiment shown in FIG. 5, the present invention is applied to a two-input NOR circuit 35, and in the embodiment of FIG. 6, the present invention is applied to a two-input NAND circuit 45. In the CMOS NOR circuit shown in FIG. 5, PMOSFETs 31 and 32, and an NMOSFET 33 are connected in series between the power source voltages $V_{DD}$ and $V_{SS}$. An NMOSFET 34 is connected in parallel with the NMOSFET 33. This circuit arrangement constitutes CMOS NOR circuit 35. An output signal $\phi 2$ of the CMOSFET circuit 35, derived from the connection point of the PMOSFET 32 and the NMOSFET 33, is supplied to the base of the bipolar transistor 37 in the buffer circuit 36. The buffer circuit 36 is comprised of the bipolar transistor 37 inserted between the power source voltages $V_{DD}$ and $V_{SS}$ and two parallel arranged NMOSFETs 38 and 39 inserted between them through the bipolar transistor 37. An input signal IN1 is applied to the gates of the PMOSFET 31 and the NMOSFET 34 in the CMOS NOR circuit 35 and the NMOSFET 38 in the buffer circuit 36. Another input signal IN2 is applied to the gates of the PMOSFET 32 and the NMOSFET 33 in the CMOS NOR circuit 35 and the NMOSFET 39 in the buffer circuit 36. An output signal OUT is derived from the emitter of the transistor 37 in the buffer circuit 36.

In the CMOS NAND circuit shown in FIG. 6, a PMOSFET 41 and NMOSFETs 42 and 43 are inserted in series between the power source voltages $V_{DD}$ and $V_{SS}$. A PMOSFET 44 is connected in parallel with the PMOSFET 41. This circuit arrangement constitutes CMOS NAND circuit 45. An output signal $\phi 3$ of the CMOS NAND circuit 45 derived from a junction point of the PMOSFET 41 and the NMOSFET 42 in CMOS NAND circuit 45 is applied to the base of the bipolar transistor 47 in a buffer circuit 46. The buffer circuit 46 is comprised of a bipolar transistor 47 and two NMOSFETs 48 and 49, which are connected in series between the power source voltages $V_{DD}$ and $V_{SS}$. An input signal IN1 is applied to the gates of the PMOSFET 41 and the NMOSFET 42 in CMOS NAND circuit 45 and the NMOSFET 48 of the buffer circuit 46. Another input signal IN2 is applied to the gates of the PMOSFET 44 and the NMOSFET 43 in CMOS NAND circuit 45 and the NMOSFET 49 in the buffer circuit 46. An output signal OUT is derived from the emitter of the transistor 47 in the buffer circuit 46.

In the CMOS NOR circuit 35 and the CMOS NAND circuit 45 thus arranged, the circuit threshold voltage $V_{thc}$, or $|V_{thP}|$ and $V_{thN}$, are selected as in the CMOS inverter in the embodiment as mentioned above. The ratio of the channel widths of the PMOSFET and NMOSFET in this arrangement is changed when compared to that of the inverter. More specifically, in the case of the CMOS NOR circuit 35, the channel width ratio of PMOSFET 31:NMOSFET 34 and PMOSFET 32:NMOSFET 33 (designated as $W_P$ and $W_N$) is:

$$W_P:W_N = 8:1 \tag{20}$$

In the case of the CMOS NAND circuit 45, the channel width ratio of $W_P$ and $W_N$ of PMOSFET 41:NMOSFET 42 and PMOSFET 44:NMOSFET 43 is:

$$W_P:W_N = 4:2 \tag{21}$$

The ratio of the channel widths WN and WN2 of NMOSFET 42:NMOSFET 48 and NMOSFET 43:NMOSFET 49 is:

$$W_N:W_{N2} = 4:24 \tag{22}$$

The CMOS NOR circuit 35 and the CMOS NAND circuit 45 can keep their high speed operation by the bipolar transistors 37 and 47 in the buffer circuits 36 and 46, respectively, as in the case of the CMOS inverter.

FIG. 7 illustrates another embodiment of a complementary MOSFET logic circuit according to the present invention. The present embodiment employs a bipolar transistor 27 Darlington connected in place of the bipolar transistor 25 of the CMOS inverter shown in FIG. 4. The output signal $\phi$ of the CMOSFET circuit 23 is applied, by way of a resistor 28, to the base of the Darlington transistor 27 in the buffer circuit 24.

In the thus arranged CMOS inverter, the resistor 28 is provided for ensuring a stable operation of the bipolar transistor 27 without being thermally broken down. The transistor 27 is used to increase the current amplification factor $\beta$ and to speed up the operation of the overall circuit.

Thus, the complementary MOSFET logic circuit shown in each of FIGS. 4 to 7 can obtain the electrical characteristic to allow complete compatibility with a TTL circuit. These CMOSFET logic circuits additionally need the buffer circuits when compared to the prior high speed CMOSFET circuit, resulting in increased manufacturing cost and increased chip area when they are fabricated in an IC. However, when compared with the prior high speed CMOSFET circuit containing the interface circuit necessary for adaptation to a TTL circuit, such an increase in manufacturing cost and chip area is remarkably small.

The CMOS inverter shown in FIG. 4 or 7, the CMOS NOR circuit shown in FIG. 5 and the CMOS NAND circuit shown in FIG. 6 have a disadvantage in that the high level voltage of the output signal OUT does not reach the amplitude of the power source voltage $V_{DD}$. This arises from the fact that a band gap voltage is present in the bipolar transistor, and that a junction voltage of some 0.6 V is generated between the base and emitter of the transistors 25, 37, 47 or the Darlington transistor 27. Therefore, if the voltage of the output signal $\phi$, $\phi 2$ or $\phi 3$ of the CMOSFET circuit 23, 35 or 45 rises to the full amplitude of $V_{DD}$, the voltage of the output signal OUT saturates at $(V_{DD} - 0.6)$ V, so that an offset voltage appears in the high level voltage of the output signal OUT.

Figure 8:
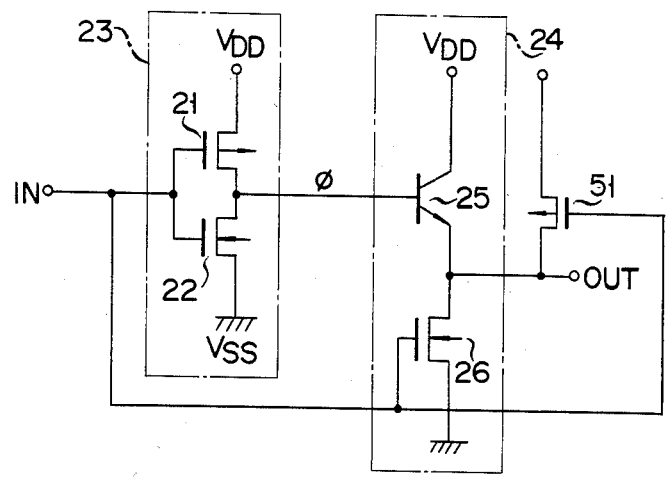
FIG. 8 shows a circuit diagram of a further embodiment of a complementary MOSFET logic circuit according to the present invention.

Another embodiment of a complementary MOSFET logic circuit according to the present invention shown in FIG. 8 is designed such that means for compensating for an offset voltage, appearing in the high level voltage of the output signal OUT, is applied to the circuit shown in FIG. 4. More particularly, a PMOSFET 51 is connected in parallel with the bipolar transistor 25 in the buffer circuit 24 in the circuit shown in FIG. 4. An input signal IN is applied to the gate of PMOSFET 51.

In the circuit thus constructed, if the threshold voltage $V_{thc}$ of the CMOSFET circuit 23 is reduced in order to obtain perfect adaptation with the output voltage characteristic of the TTL circuit, the rise time $t_{ro}$ and the fall time $t_{fo}$ of the output signal OUT may be reduced by the bipolar transistor 25 with a large driving power current and the NMOSFET 26 with a large coefficient $K_N$ of $I_{DS}$. This indicates that the high speed operation of the circuit is not deteriorated. When the additional PMOSFET 51 is not used, the output signal OUT does not swing up to $V_{DD}$ to produce an offset voltage of some 0.6 V. When the PMOSFET 21 in the CMOSFET circuit 23 is turned on and the transistor 25 is driven by the signal $\phi$, the PMOSFET 51 has already been turned on by the input signal IN. Accordingly, when the base emitter voltage of the transistor 25 approaches 0.6 V, it is charged to the full magnitude of $V_{DD}$. Therefore, the output signal OUT may be swung, when it is in a high level, to the full amplitude of $V_{DD}$.

In connection with the PMOSFET 51, the only necessity is to compensate for the offset voltage due to the base-emitter voltage of the transistor 25. Therefore, its $g_m$ may be small. This implies that the size of the element may be reduced, and that the increase of the chip size due to the addition of the PMOSFET 51 is negligible.

Figure 9:
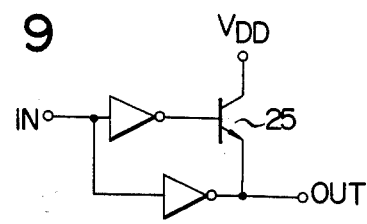
FIG. 9 is an equivalent circuit of the circuit shown in FIG. 8.

In FIG. 8, the CMOSFET circuit 23 made up of the PMOSFET 21 and the NMOSFET 22 is a CMOS inverter. The PMOSFET 51 and NMOSFET 26 also form a CMOS inverter. The equivalent circuit of the FIG. 8 circuit is as shown in FIG. 9.

Figure 10:
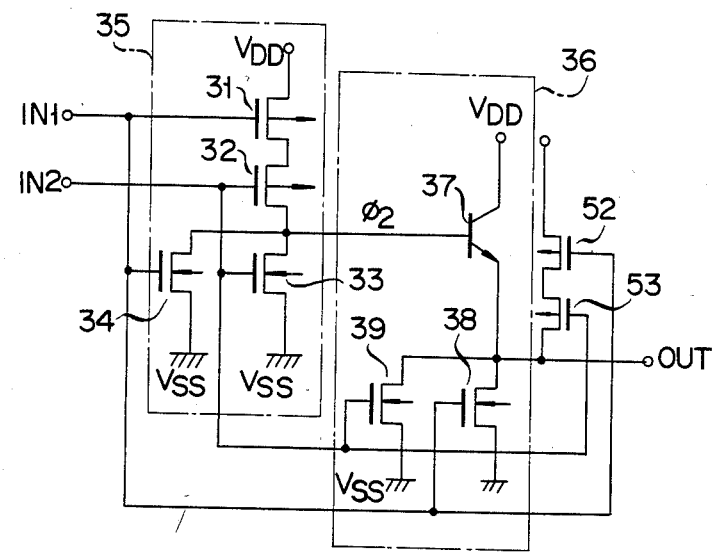
FIG. 10 is a circuit diagram of still a further embodiment of a complementary MOSFET logic circuit according to the present invention.

FIG. 10 shows a complementary MOSFET logic circuit which is another embodiment of the present invention, in which means for compensating for an offset voltage appearing in the high voltage of the output signal OUT is applied to the circuit shown in FIG. 5. Specifically, two PMOSFETs 52 and 53, connected in series, are connected in parallel with the bipolar transistor 37 of the buffer circuit 36 in the circuit shown in FIG. 5. An input signal IN1 is applied for the gate of the PMOSFET 52, while another input signal IN2 is applied to the gate of the PMOSFET 53.

Also in the circuit thus constructed, if the threshold voltage $V_{thc}$ of the CMOSFET circuit 35 is reduced in order to obtain a perfect adaptation with the output voltage characteristics of a TTL circuit, the rise time $t_{ro}$ and the fall time $t_{fo}$ of the output signal OUT may be reduced by the bipolar transistor 37 with a large driving power current and the NMOSFET 38 or 39 with a large coefficient of $I_{DS}$. Therefore, in the circuit shown in FIG. 10, there is no deterioration of the high speed operation. Further, if the base-emitter voltage is asymptotic to 0.6 V because of the addition of two PMOSFETs 52 and 53, the output signal OUT is charged up to the full amplitude of $V_{DD}$ by both the PMOSFETs 52 and 53. Additionally, only the compensation of the offset voltage due to the base-emitter voltage of the transistor 37 is required for the PMOSFETs 52 and 53. Therefore, a reduction in element size is possible. Therefore, the increase of the chip size due to the addition of the PMOSFETs 52 and 53 is almost negligible.

Figure 11:
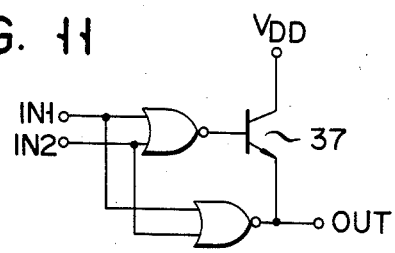
FIG. 11 is an equivalent circuit of the circuit shown in FIG. 10.

In FIG. 10, the CMOSFET circuit made up of PMOSFETs 31 to 34 is CMOS NOR circuit 35. The PMOSFETs 52 and 53 and the NMOSFETs 38 and 39 form a CMOS NOR circuit. Accordingly, the equivalent circuit shown in FIG. 10 is as shown in FIG. 11.

Figure 12:
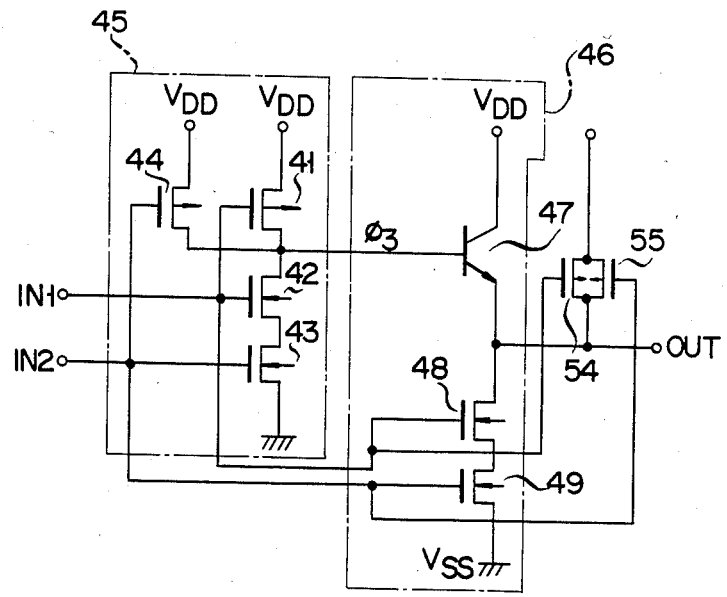
FIG. 12 is a circuit diagram of an even further embodiment of a complementary MOSFET logic circuit according to the present invention.

In FIG. 12, illustrating another embodiment of a complementary MOSFET logic circuit according to the present invention, means for compensating for an offset voltage produced in the high level voltage of the output signal OUT is applied to the FIG. 6 circuit. In the circuit of FIG. 12, two PMOSFETs 54 and 55 are connected in parallel with the bipolar transistor of the buffer circuit 46 shown in the FIG. 6 circuit. An input signal IN1 is applied to the gate of PMOSFET 54, while another input signal IN2 is applied to the gate of PMOSFET 55.

In the circuit arrangement as mentioned above, as in the FIG. 6 circuit, if the circuit threshold voltage $V_{thc}$ of the CMOS NAND circuit 45 is reduced to obtain perfect compatibility with the output voltage characteristic of the TTL circuit, the rise time $t_{ro}$ and the fall time $t_{fo}$ of the output signal OUT may be reduced by the bipolar transistor 47 with a large driving power current and the NMOSFETs 48 and 49 with a large coefficient $K_N$ of the $I_{DS}$. The FIG. 12 circuit does not damage the high speed operation. Moreover, because of the addition of two PMOSFETs 54 and 55, if the base-emitter voltage of the transistor 47 approaches 0.6 V, the output signal OUT is fully charged to the $V_{DD}$ by the PMOSFETs 54 and 55. Only compensation of the offset voltage due to the base-emitter voltage is required for the PMOSFETs 54 and 55. Accordingly, element size reduction is possible. As a consequence, the chip size increase due to the addition of the PMOSFETs 54 and 55 is almost negligible.

Figure 13:
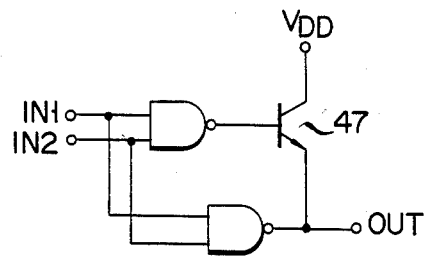
FIG. 13 shows an equivalent circuit of the circuit shown in FIG. 12.

In FIG. 12, a CMOS NAND circuit 45 is made up of the PMOSFETs 41 and 44 and NMOSFETs 42 and 43. Since the PMOSFETs 54 and 55 and NMOSFETs 48 and 49 form a CMOS NAND circuit, an equivalent circuit of the FIG. 12 circuit is as shown in FIG. 13.

Figure 14:
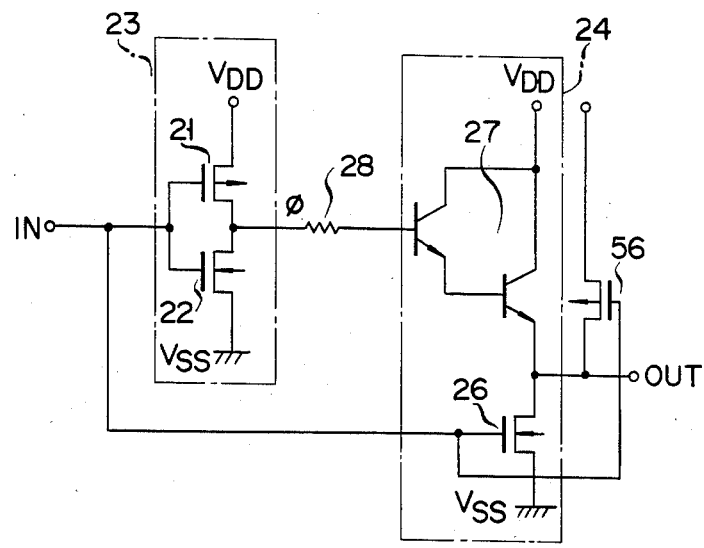
FIG. 14 is a circuit diagram of a further object of a complementary MOSFET logic circuit according to the present invention.

FIG. 14 shows a further embodiment of a complementary MOSFET logic circuit according to the present invention. In this figure, means for compensating for the offset voltage appearing in the high level voltage of the output signal OUT is applied to the FIG. 7 circuit. In the circuit, a PMOSFET 56 is connected in parallel with the bipolar transistor 27 of the buffer circuit 24 in the FIG. 7 circuit. An input signal IN is applied to the gate of the PMOSFET 5.

In the circuit arrangement of the present embodiment, as in the FIG. 7 circuit, if the threshold voltage $V_{thc}$ of the CMOSFET circuit 23 is to obtain perfect compatibility with the output voltage characteristic of the TTL circuit, the rise time $t_{ro}$ and the fall time $t_{fo}$ of the output signal OUT may be reduced by the Darlington transistor 27 with a large driving power current and an NMOSFET 26 with a large coefficient $K_N$ of $I_{DS}$. Accordingly, no deterioration of the high speed operation of the circuit ensues. Because of the addition of the PMOSFET 56, if the base-emitter voltage of the transistor 27 approaches 0.6 V, the PMOSFET 56 charges the output signal OUT up to the $V_{DD}$. Also in this case, only the compensation of the offset voltage due to the base-emitter voltage of the transistor 27 for the PMOSFET 56 is required, and this enables the elements to be size-reduced. Accordingly, an increase in chip size due to the addition of the PMOSFET 56 is almost negligible.

Figure 15:
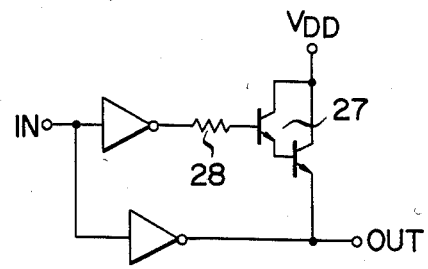
FIG. 15 shows an equivalent circuit of the circuit shown in FIG. 14.

In FIG. 14, CMOSFET circuit 23 including PMOSFET 21 and NMOSFET 22 is a CMOS inverter. PMOSFET 56 and NMOSFET 26 form a CMOS inverter. The equivalent circuit of the FIG. 14 circuit is as shown in FIG. 15.

Thus, the complementary MOSFET logic circuit shown in FIGS. 8, 10, 12 or 14 has an electrical characteristic perfectly compatible with that of a TTL circuit, and is capable of boosting the voltage amplitude of the output signal OUT to the power source voltage $V_{DD}$.

In the circuit shown in FIG. 4, when the $V_{DD}$ is 5 V and the high voltage $V_{IH}$ of the input signal IN is 2.0 V, the gate bias voltage of the PMOSFET 21 is $(V_{DD}-V_{TH})\approx 3$ V. The DC leakage-current is produced unless the threshold voltage $V_{thP}$ of the PMOSFET 21 is above 3.0 V. Accordingly, when the $V_{DD}$ is fixed to 5 V, if $|V_{thP}|\approx 3.0$ V, the low power consumption is secured. If something increases the consumption of the battery when the circuit is battery-driven and $V_{DD}$ reduces from 5 V to 3 V, the circuit shown in FIG. 4 fails to secure a stable operation.

In FIG. 16, illustrating another embodiment of a complementary MOSFET logic circuit according to the present invention, means for securing a stable operation when the power source voltage $V_{DD}$ drops from a normal value is applied to the circuit shown in FIG. 4. More specifically, a PMOSFET 61 is connected between the output terminal of the CMOS circuit 23, i.e., a series connection point of the PMOSFET 21 and PMOSFET 61, and the power source $V_{DD}$ in FIG. 4. An input signal IN is applied to the gate of the PMOSFET 61. PMOSFET 61 is fabricated to have a threshold voltage $V_{thP}$ different than that of the PMOSFET 21 in the CMOSFET circuit 23. The circuit of FIG. 16 is designed to have an optimum operation under the condition that the $g_m$ ratio of the PMOSFET 21 and NMOSFET 22 is 4:1, the threshold voltage $V_{thP}$ of the PMOSFET 21 is approximately $-3.0$ V, the threshold voltage $V_{thn}$ of the NMOSFET 22 is approximately 0.8 V, the high level voltage $V_{IH}$ of the input signal IN is nearly equal to 2.0 V, and its low level voltage $V_{IL}=0.8$ V. The threshold voltage of the additionally used PMOSFET 61 is about $-1.0$ V, and the $g_m$ ratio of the PMOSFET 21 and PMOSFET 61 is 4:1.

With such an arrangement, when $V_{DD}=5$ V and the input signal is 2.0 V ($=V_{IH}$), the PMOSFET 21 is completely turned off and the NMOSFET 22 is completely turned on. Since its $g_m$ is much smaller than that of the NMOSFET 22, the signal $\phi$ is low in level. At this time, the PMOSFET 61 is ON. Accordingly, the DC leakage-current is produced. Nevertheless, this is very small when compared with the relatively small threshold voltage of the PMOSFET 21. The DC leakage-current $I_{DD}$ (DC) may be expressed by the following proportional relation:

$$I_{DD}(D.C.)\propto g_{mP}(V_{DD}-V_{IH}-|V_{thp}|)^2 \quad (23)$$

Since the $g_m$ of the PMOSFET 21 is four times that of the PMOSFET 61, the leakage-current when the PMOSFET 61 is provided is smaller than when PMOSFET 61 is not provided.

When the $V_{DD}$ is 3.8 V, if an input signal IN=0.8 V is inputted, the PMOSFET 21 is not turned on, but the PMOSFET 61 is turned on. That is to say, when the voltage $V_{DD}$ drops to 3.8 V, the output signal $\phi$ is not high in level when the PMOSFET 61 is not provided. When it is provided, it forms a current path, so that the signal $\phi$ is high in level. The current $I_{DSP61}$ flowing through the PMOSFET 61 is given by:

$$I_{DSP61}\propto g_{mP61}(V_{DD}-V_{IL}-|V_{thP61}|)^2 \alpha 4 \cdot g_{mP21}, \quad (24)$$
$g_{mp61}$: $g_m$ of PMOSFET 61.
$g_{mp21}$: $g_m$ of PMOSFET 21.

When $V_{DD}=5$ V and $V_{IL}=0.8$ V and the PMOSFETs 21 and 61 are both ON, the drain currents $I_{DSP21}$ and $I_{DSP61}$ are:

$$I_{DSP21}\propto 1.44\, g_{mP21} \quad (25)$$

$$I_{DSP61}\propto 10.24\, g_{MP61} \quad (26)$$

Since the sum of the drain currents flows, $g_{mP21}:g_{mP61}=4:1$ is substituted into the above equations and the driving powers of the FET when $V_{DD}=5$ V and $V_{DD}=3.8$ V will be compared with each other:

$$\frac{I_{DSP61}(V_{DD}=3.8\text{ V})}{I_{DSP21}(V_{DD}=5\text{ V})+I_{DSP61}(V_{DD}=5\text{ V})}\approx \quad (27)$$

$$\frac{4\times 1}{1.44\times 4+10.24\times 1}\approx \tfrac{1}{4}.$$

As seen from the above relation, the driving power of the PMOSFET when $V_{DD}=5$ V is $\tfrac{1}{4}$ that when $V_{DD}=3.8$ V. Accordingly, the rise time of the signal $\phi$ is large. In general in a CMOSFET circuit when the power source voltage drops, the switching time increases as a matter of course. An increase of the switching time however, does not matter.

When the voltage $V_{DD}$ drops to 3.8 V, if $V_{DD}$ satisfies the relation $V_{DD}>V_{IL}-|V_{thP61}|\approx 1.8$ V, stable operation is ensured. If the $V_{thP61}$ is set at $-1.0$ V, as in the previous case, the circuit operates normally even if $V_{DD}$ drops to 2 V or so. Further, by properly setting the $g_m$ ratios of the PMOSFETs 21 and 61, the DC leakage-current caused by the input level change may be limited.

As described above, the above embodiment of FIG. 16 has an electrical characteristic perfectly compatible with that of the TTL circuit, has minimum power consumption and ensures its normal operation when the power source voltage drops from its normal value.

Turning now to FIG. 17, there is shown a further embodiment of a complementary CMOSFET logic circuit. In the present embodiment, means to compensate for power source voltage drop is applied to the FIG. 5 circuit. In the circuit of FIG. 17, two PMOSFETs 62 and 63 are connected between the output terminal of the CMOSFET circuit 35 in the circuit shown in FIG. 5, i.e., a connection point of the PMOSFET 32 and the NMOSFET 33, and a power source $V_{DD}$. An input signal IN1 is applied to the gate of the PMOSFET 62, and another input signal IN2 is applied to the gate of the PMOSFET 63. In the circuit, the threshold voltages of the two PMOSFETs 31 and 32 in CMOS NOR circuit 35 are set to be equal to each other, and those of the PMOSFETs 62 and 63 are set in a similar way. The threshold voltage of each of the PMOSFETs 62 and 63 is set to be larger (smaller in the absolute value) than that of the PMOSFET 31 or 32. In this way, a normal operation of the circuit is ensured when the power source voltage drops. Further, by selecting the $g_m$ values of the PMOSFETs 31 and 32 to be larger than those of the PMOSFETs 62 and 63, the DC leakage-current and the power consumption may be reduced.

Figure 18:
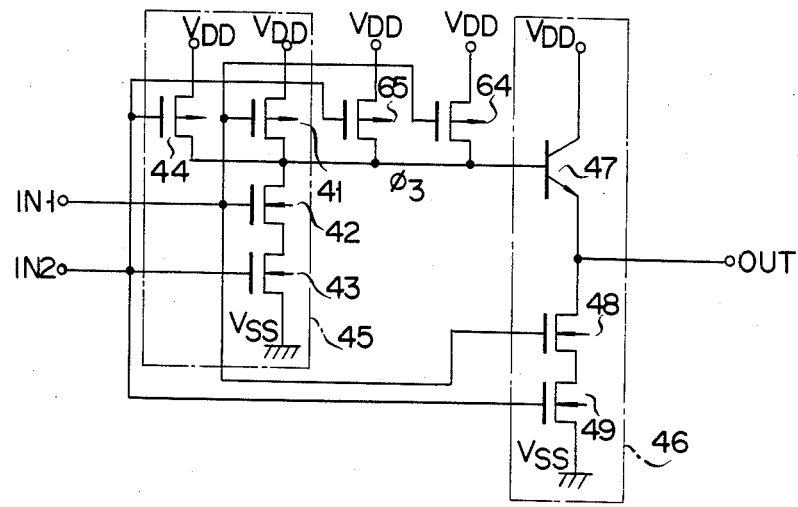
FIG. 18 is a circuit diagram of a complementary MOSFET logic circuit which is an embodiment of the present invention.

FIG. 18 shows an even further embodiment of a complementary MOSFET logic circuit according to the present invention. In the present embodiment, means to compensate for power source voltage reduction is applied to the FIG. 6 circuit. In the present embodiment, two PMOSFETs 64 and 65 are connected in parallel between the output terminal of the CMOSFET circuit 45 in the FIG. 6 circuit, i.e., a connection point between the PMOSFET 41 and the NMOSFET 42, and the power source $V_{DD}$. An input signal IN1 is applied to the gate of the PMOSFET 64, and another input signal IN2 is applied to the gate of the PMOSFET 65. In the circuit, the threshold voltages of the two PMOSFETs 41 and 44 in the MOSFET circuit 45 are selected to be equal to each other. Similarly, the threshold voltages of the PMOSFETs 64 and 65 are selected to be equal. Further, the threshold voltage of each of the PMOSFETs 64 and 65 is selected to be larger (smaller in the absolute value) than that of each of the PMOSFETs 41 and 44. In this way, a normal operation of the circuit when the power source voltage drops is ensured. As in the case of the circuit of FIG. 17, the $g_m$ values of the PMOSFETs 41 and 44 are selected to be smaller than those of the PMOSFETs 64 and 65. With this arrangement, the DC leakage-current and the power consumption are reduced.

Figure 19:
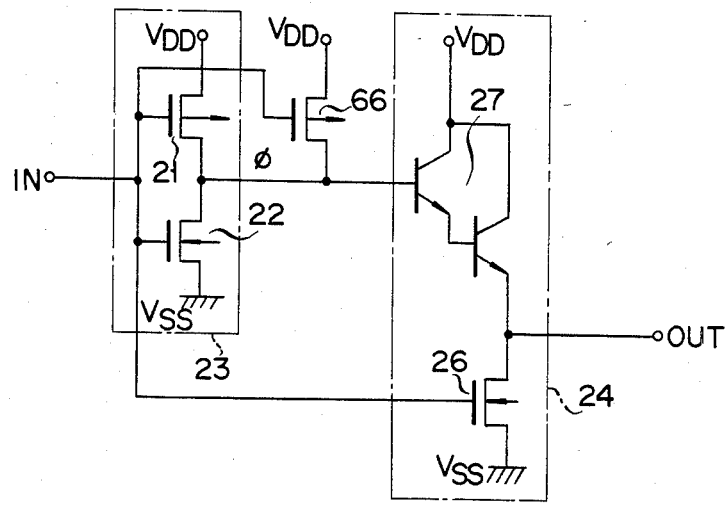
FIG. 19 is a circuit diagram of a complementary MOSFET logic circuit which is another embodiment of the present invention.

FIG. 19 shows a complementary MOSFET logic circuit which is another embodiment of the present invention. The present embodiment also includes means to compensate for power source voltage reduction applied to the FIG. 7 circuit. To be more specific, a PMOSFET 66 is connected between the output terminal of the CMOSFET circuit 23 in the FIG. 7 circuit, i.e., a connection point between the PMOSFET 21 and the NMOSFET 22 and a power source $V_{DD}$. An input signal IN is applied to the gate of the PMOSFET 66. The threshold voltage of the PMOSFET 66 is larger (smaller in the absolute value) than that of the PMOSFET 21 in the CMOSFET circuit 23, as in the case of the FIG. 16 circuit. Thus, the present embodiment also can ensure a normal operation of the circuit when the power source voltage drops.

The complementary MOSFET logic circuits shown in FIGS. 16 to 19 each have an electrical characteristic having perfect compatibility with the TTL circuit and each ensure normal operation when the power source voltage drops.

In the FIG. 19 circuit, the resistor 28 is omitted, but it may be provided as in the circuit of FIG. 7, if necessary.

Figure 20:
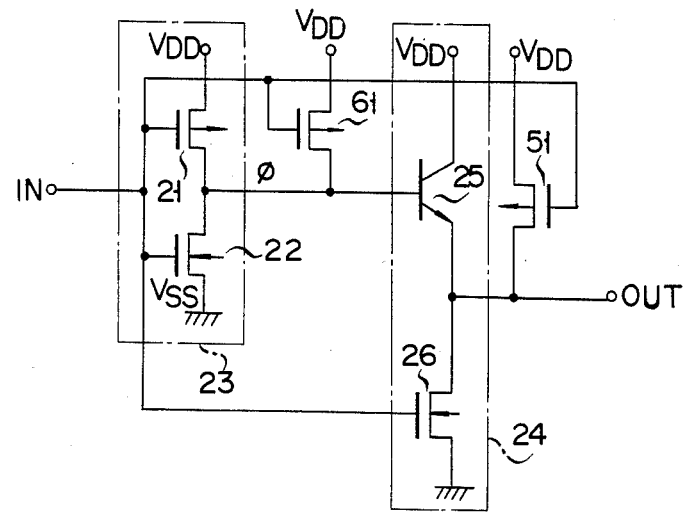
FIG. 20 is a circuit diagram of a complementary MOSFET logic circuit which is yet another embodiment of the present invention.

In FIG. 20, illustrating another embodiment of a complementary MOSFET logic circuit according to the present invention, means to compensate for the power source voltage drop problem is applied to the FIG. 8 circuit. As shown, a PMOSFET 61, of which the threshold voltage is larger (smaller in the absolute value) than that of the PMOSFET 21 in the CMOSFET circuit 23, is connected between the output terminal of the CMOSFET circuit 23 in the FIG. 8 circuit, i.e., a connection point between the PMOSFET 21 and the NMOSFET 22.

In this circuit arrangement, the provision of the PMOSFET 51 enables the output signal OUT to be boosted to the full magnitude of the $V_{DD}$. Because of the provision of the PMOSFET 61, normal operation is ensured even when the power source voltage $V_{DD}$ drops from the normal value. By setting the $g_m$ of the PMOSFET 21 at a value larger than that of the PMOSFET 61, the DC leakage-current and the power consumption may be reduced.

Figure 21:
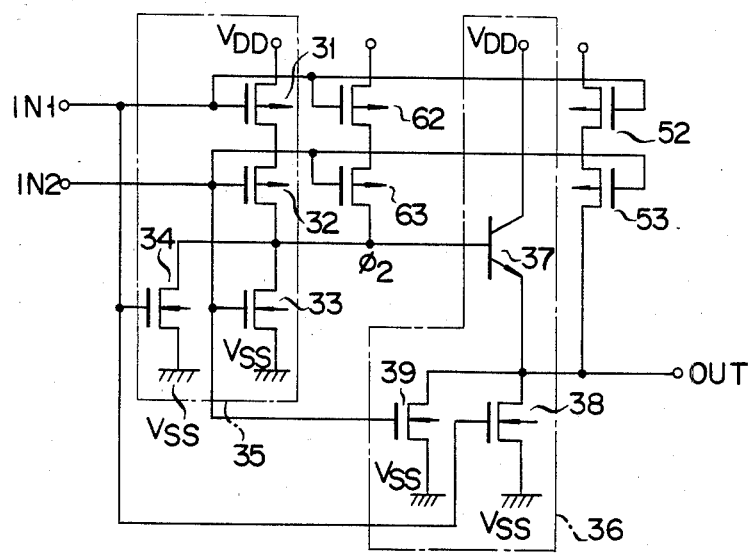
FIG. 21 is a circuit diagram of a complementary MOSFET logic circuit which is a further object of the present invention.

FIG. 21 shows a complementary MOSFET logic circuit which is another embodiment of the present invention. The present embodiment includes means to compensate for power source voltage drop applied to the FIG. 10 circuit. Two PMOSFETs 62 and 63 are connected in series between the output terminal of the CMOSFET circuit 35 in the FIG. 10 circuit, i.e., a connection point between the PMOSFET 32 and NMOSFET 33, and the power source $V_{DD}$. An input signal IN1 is applied to the gate of the PMOSFET 62, and another input signal IN2 is applied to the gate of the PMOSFET 63.

In the circuit, the threshold voltages of the two PMOSFETs 31 and 32 in the CMOSFET circuit 35 are selected to be equal to each other. Similarly, the threshold voltages of the PMOSFETs 62 and 63 are selected so as to have equal values. Further, by setting the threshold values of the latter FETs at values larger (smaller in the absolute value) than those of the former, a normal operation of the circuit is ensured when the power source voltage $V_{DD}$ drops from its normal value. Further, since the PMOSFETs 52 and 53 are provided, the output signal OUT may be boosted to the $V_{DD}$.

Figure 22:
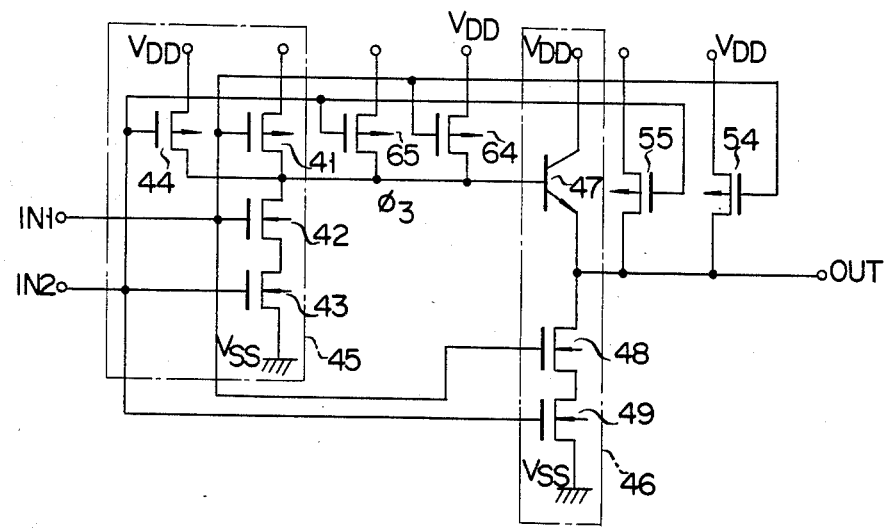
FIG. 22 is a circuit diagram of a complementary MOSFET logic circuit according to still another embodiment of the present invention.

FIG. 22 shows an additional embodiment of a complementary CMOSFET logic circuit according to the present invention. The present embodiment compensates for the power source voltage drop problem by making use of the FIG. 12 circuit. In this circuit, two PMOSFETs 64 and 65 are connected in parallel between the output terminal of the CMOS NAND circuit 45 in the FIG. 12 circuit, i.e., a connection point between the PMOSFET 41 and NMOSFET 42, and the power source $V_{DD}$. An input signal IN1 is applied to the gate of the PMOSFET 64, while another input signal IN2 is applied to the gate of the PMOSFET 65.

Also in this circuit, threshold voltages of the two PMOSFETs 41 and 44 in the CMOS NAND 45 are selected to have equal values. The same is true for the threshold values of the PMOSFETs 64 and 65. The threshold values of the latter FETs are larger (smaller in the absolute value) than those of the former FETs. This feature ensures a normal operation of the circuit when the power source voltage drops. The provision of the PMOSFETs 54 and 55 allows the output signal OUT to be boosted to the full amplitude of the $V_{DD}$.

Figure 23:
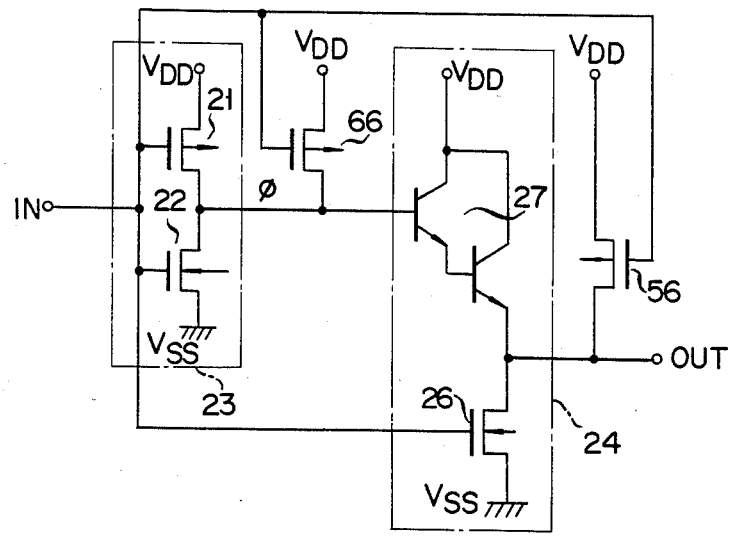
FIG. 23 is a circuit diagram of a complementary MOSFET logic circuit according to an embodiment of the present invention.

FIG. 23 shows a circuit diagram of even a further embodiment of a complementary MOSFET logic circuit according to the present invention. The present embodiment further compensates for the power source voltage drop by making use of the FIG. 14 circuit. A PMOSFET 66, of which the threshold voltage is larger (smaller in the absolute value) than that of the PMOSFET 21 in the CMOSFET circuit 23, is connected between the output terminal of the CMOSFET circuit 23 in the circuit shown in FIG. 14, i.e., a connection point between the PMOSFET 21 and the NMOSFET 22, and the power source $V_{DD}$.

In this circuit arrangement, the provision of the PMOSFET 56 allows the output signal OUT to be boosted to the full amplitude of the $V_{DD}$. The additional use of the PMOSFET 66 ensures a normal operation of the circuit when the power source voltage drops from its normal value. The resistor 28, which is omitted in the present circuit, may be provided if necessary.

Accordingly, the complementary MOSFET logic circuits shown in FIGS. 20 to 23 each have an electrical characteristic with a perfect compatibility with that of a TTL circuit. Further, each allows the output signal OUT to be boosted to the full amplitude of $V_{DD}$. Additionally, when the power source voltage drops from its normal value, a normal operation of each circuit is ensured.

It should be understood that the present invention is not limited by the above-mentioned specific embodiments, but may be changed and modified variously within the scope of the present invention. For example, the two-input CMOS NOR circuit 35 and CMOS NAND circuit 45 may be replaced by three- or more-input CMOSFET circuits.

What we claim is:

1. A complementary MOSFET logic circuit for use with a TTL (Transistor-Transistor Logic) circuit, comprising:
    a signal input terminal means for receiving output signals from said TTL circuit;
    a signal output terminal for supplying output signals to an external circuit;
    a complementary MOSFET circuit means which comprises at least one P-channel MOSFET, at least one N-channel MOSFET, an input terminal coupled to said signal input terminal means, and an output terminal, said complementary MOSFET circuit means having an input voltage characteristic determined by the ratio of the channel width of said P-channel MOSFET to that of said N-channel MOSFET, and which input voltage characteristic matches the output voltage characteristic of said TTL circuit;
    a bipolar transistor circuit including a bipolar transistor whose collector-emitter path is connected between a first power source and said signal output terminal and whose base is connected to the output terminal of said complementary MOSFET circuit means;
    a first MOSFET circuit comprising at least one N-channel MOSFET whose source-drain path is connected between a second power source and said signal output terinal and whose gate is connected to said signal input terminal means; and
    a second MOSFET circuit comprising at least one P-channel MOSFET whose source-drain path is connected between said first power source and the output terminal of said complementary MOSFET circuit means and whose gate is connected to said signal input terminal means, and whose threshold voltage is different from that of said P-channel MOSFET of said complementary MOSFET circuit means.

2. A complementary MOSFET logic circuit according to claim 1, wherein said complementary MOSFET circuit means is an inverter.

3. A complementary MOSFET logic circuit according to claim 2, wherein said first MOSFET circuit consists of only one N-channel MOSFET whose source-drain path is connected between said second power source and said signal output terminal and whose gate is connected to said signal input terminal means.

4. A complementary MOSFET logic circuit according to claim 2, wherein said second MOSFET circuit consists of only one P-channel MOSFET whose source-drain path is connected between said first power source and the output terminal of said complementary MOSFET circuit means and whose gate is connected to said signal input terminal means.

5. A complementary MOSFET logic circuit according to claim 1, wherein said complementary MOSFET circuit means is a NOR circuit and said signal input terminal means includes at least first and second input terminals.

6. A complementary MOSFET logic circuit according to claim 5, wherein said first MOSFET circuit comprises at least two N-channel MOSFETs whose source-drain paths are connected in parallel between said second power source and said signal output terminal and whose gates are connected to said first and second signal input terminals, respectively.

7. A complementary MOSFET logic circuit according to claim 5, wherein said second MOSFET circuit comprises at least two P-channel MOSFETs whose source-drain paths are connected in series between said first power source and the output terminal of said complementary MOSFET circuit means and whose gates are connected to said first and second signal input terminals, respectively.

8. A complementary MOSFET logic circuit according to claim 1, wherein said complementary MOSFET circuit means is a NAND circuit and said signal input terminal means includes at least first and second input terminals.

9. A complementary MOSFET logic circuit according to claim 8, wherein said first MOSFET circuit comprises at least two N-channel MOSFETs whose source-drain paths are connected in series between said second power source and said signal output terminal and whose gates are connected to said first and second signal input terminals, respectively.

10. A complementary MOSFET logic circuit according to claim 8, wherein said second MOSFET circuit comprises at least two P-channel MOSFETs whose source-drain paths are connected in parallel between said first power source and the output terminal of said complementary MOSFET circuit means and whose gates are connected to said first and second signal input terminals, respectively.

11. A complementary MOSFET logic circuit according to claim 1, wherein said bipolar transistor circuit comprises one bipolar transistor.

12. A complementary MOSFET logic circuit according to claim 1, wherein said bipolar transistor circuit comprises a Darlington pair of transistors.

13. A complementary MOSFET logic circuit for use with a TTL (Transistor-Transistor Logic) circuit, comprising:
    a signal input terminal means for receiving output signals from said TTL circuit;
    a signal output terminal for supplying output signals to an external circuit;
    a complementary MOSFET circuit means which comprises at least one P-channel MOSFET, at least one N-channel MOSFET, an input terminal coupled to said signal input terminal means, and an output terminal, said complementary MOSFET circuit means having an input voltage characteristic determined by the ratio of the channel width of said P-channel MOSFET to that of said N-channel MOSFET, and which input voltage characteristic matches the output voltage characteristic of said TTL circuit;
    a bipolar transistor circuit whose collector-emitter path is connected between a first power source and said signal output terminal and whose base is connected to the output terminal of said complementary MOSFET circuit means;
    a first MOSFET circuit comprising at least one N-channel MOSFET whose source-drain path is connected between a second power source and said signal output terminal and whose gate is connected to said signal input terminal means;

a second MOSFET circuit comprising at least one P-channel MOSFET whose source-drain path is connected between said first power source and the output terminal of said complementary MOSFET circuit means, whose gate is connected to said signal input terminal means, and whose threshold voltage is different from that of said P-channel MOSFET of said complementary MOSFET circuit means; and a third MOSFET circuit comprising at least one P-channel MOSFET whose source-drain path is connected between said first power source and said signal output terminal and whose gate is connected to said signal input terminal means.

14. A complementary MOSFET logic circuit according to claim 13, wherein said complementary MOSFET circuit means is an inverter.

15. A complementary MOSFET logic circuit according to claim 14, wherein said first MOSFET circuit consists of only one N-channel MOSFET whose source-drain path is connected between said second power source and said signal output terminal, and whose gate is connected to said signal input terminal means.

16. A complementary MOSFET logic circuit according to claim 14, wherein said second MOSFET circuit consists of only one P-channel MOSFET whose source-drain path is connected between said first power source and the output terminal of said complementary MOSFET circuit means, and whose gate is connected to said signal input terminal means.

17. A complementary MOSFET logic circuit according to claim 14, wherein said third MOSFET circuit consists of only one P-channel MOSFET whose source-drain path is connected between said first power source and said signal output terminal and whose gate is connected to said signal input terminal means.

18. A complementary MOSFET logic circuit according to claim 13, wherein said complementary MOSFET circuit means is a NOR circuit and said signal input terminal means includes at least first and second input terminals.

19. A complementary MOSFET logic circuit according to claim 18, wherein said first MOSFET circuit comprises at least two N-channel MOSFETs whose source-drain paths are connected in parallel between said second power source and said signal output terminal and whose gates are connected to said first and second signal input terminals, respectively.

20. A complementary MOSFET logic circuit according to claim 18, wherein said second MOSFET circuit comprises at least two P-channel MOSFETs whose source-drain paths are connected in series between said first power source and the output terminal of said complementary MOSFET circuit means and whose gates are connected to said first and second signal input terminals, respectively.

21. A complementary MOSFET logic circuit according to claim 18, wherein said third MOSFET circuit comprises at least two P-channel MOSFETs whose source-drain paths are connected in series between said first power source and said signal output terminal and whose gates are connected to said first and second signal input terminals, respectively.

22. A complementary MOSFET logic circuit according to claim 13, wherein said complementary MOSFET circuit means is a NAND circuit and said signal input terminal means includes at least first and second input terminals.

23. A complementary MOSFET logic circuit according to claim 22, wherein said first MOSFET circuit comprises at least two N-channel MOSFETs whose source-drain paths are connected in series between said second power source and said signal output terminal and whose gates are connected to said first and second signal input terminals, respectively.

24. A complementary MOSFET logic circuit according to claim 22, wherein said second MOSFET circuit comprises at least two P-channel MOSFETs whose source-drain paths are connected in parallel between said first power source and the output terminal of said complementary MOSFET circuit means and whose gates are connected to said first and second signal input terminals, respectively.

25. A complementary MOSFET logic circuit according to claim 22, wherein said third MOSFET circuit comprises at least two P-channel MOSFETs whose source-drain paths are connected in parallel between said first power source and said signal output terminal and whose gates are connected to said first and second signal input terminals, respectively.

* * * * *